(12) United States Patent
Lansford et al.

(10) Patent No.: US 6,291,253 B1
(45) Date of Patent: *Sep. 18, 2001

(54) FEEDBACK CONTROL OF DEPOSITION THICKNESS BASED ON POLISH PLANARIZATION

(75) Inventors: Jeremy Lansford; Allen L. Evans, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/378,348

(22) Filed: Aug. 20, 1999

(51) Int. Cl.$^7$ ............... H01L 21/00; H01L 21/66
(52) U.S. Cl. ............... 438/14; 438/16; 438/17; 438/784

(58) Field of Search .................. 438/14, 3, 22, 438/59, 16, 17, 784, 484, 586

(56) References Cited

U.S. PATENT DOCUMENTS 6,057,068 * 5/2000 Reader et al. .............. 430/30

* cited by examiner

Primary Examiner—Michael Lebentritt
(74) Attorney, Agent, or Firm—Williams, Morgan & Amerson, P.C.

(57) ABSTRACT

The present invention is directed to semiconductor processing operations, and, more particularly, to a method and system for adjusting the thickness of process layers based upon the planarization efficiency of polishing operations. In one embodiment, the invention comprises determining the planarization efficiency of polishing operations, and adjusting the manufactured thickness of a process layer based upon the determined planarization efficiency.

18 Claims, 4 Drawing Sheets

FEEDBACK CONTROL OF DEPOSITION THICKNESS BASED ON POLISH PLANARIZATION

BACKGROUND OF THE INVENTION

1. Field of the Invention

The present invention is generally related to the field of semiconductor processing, and, more particularly, to planarization operations in semiconductor processing operations.

2. Description of the Related Art

Chemical mechanical polishing ("CMP") is widely used in semiconductor processing operations to planarize various process layers, e.g., silicon dioxide, formed above a wafer comprised of a semiconducting material, such as silicon. Chemical mechanical polishing operations typically employ an abrasive slurry distributed in an alkaline or acidic solution to planarize the surface of a process layer through a combination of mechanical and chemical actions.

FIG. 1 is a schematic drawing of one illustrative embodiment of a chemical mechanical polishing tool used in semiconductor processing operations. As depicted therein, the illustrative polishing tool 10 is comprised of a rotatable table 12 on which an illustrative polishing pad 14 is mounted, and a multi-head carrier 16 positioned above the pad 14. The multi-head carrier 16 includes a plurality of rotatable polishing arms 18, each of which includes a carrier head 20. Typically, wafers (not shown) are secured to the carrier heads 20 by the use of vacuum pressure. This is sometimes referred to as the carrier backforce pressure. In use, the table 12 is rotated and an abrasive slurry is dispensed onto the polishing pad 14. Once the slurry has been applied to the polishing pad 14, a downforce is applied to each rotating polishing arm 18 to press its respective wafer against the polishing pad 14. As the wafer is pressed against the polishing pad 14, the surface of the process layer on the wafer is mechanically and chemically polished. Although the tool depicted in FIG. 1 is a multi-head polishing tool 10, similar single-head type machines exist in the industry, and the present invention is not limited to any particular embodiment, form or structure of a tool that may be used to perform chemical mechanical polishing operations.

The continual drive to reduce feature sizes, e.g., channel length, on semiconductor devices has increased the importance of chemical mechanical polishing or planarization in the semiconductor fabrication process. For example, as feature sizes tend to decrease, the depth of field of photolithography equipment tends to shrink, thereby necessitating a very flat or planar surface so that very small dimensions may be accurately patterned on a wafer. Additionally, there has been, and continues to be, a constant drive to increase the productivity of fabrication techniques employed in making modern semiconductor devices. In short, there is a constant drive within the industry to make the same high-quality semiconductor products, but to do it faster, better, and in a less expensive manner.

One problem encountered in modem processing operations is that process films yet to be planarized are sometimes made excessively thick to compensate for variations in the planarization operation performed by a planarization tool, e.g., a CMP tool. For example, a process layer may be made relatively thicker to allow the planarization tool sufficient time to produce a planar surface before reaching the desired final thickness of the process layer after planarization. The formation of the additional thickness of the process layer prior to planarization results in an increase in time and materials to initially form the layer, and an increase in the planarization time and amount of consumable materials used in the planarization process.

The present invention is directed to a method of solving, or at least reducing, some or all of the aforementioned problems.

SUMMARY OF THE INVENTION

The present invention is directed to semiconductor processing operations, particularly in the area of manufacturing process layers comprised of a variety of materials, and planarizing a surface of such a process layer. More particularly, in one illustrative embodiment, the present invention is directed to determining a planarization efficiency of a planarization operation, and manufacturing a process layer to a thickness based upon the determined planarization efficiency of the planarization operation.

BRIEF DESCRIPTION OF THE DRAWINGS

The invention may be understood by reference to the following description taken in conjunction with the accompanying drawings, in which like reference numerals identify like elements, and in which.

Figure 1:
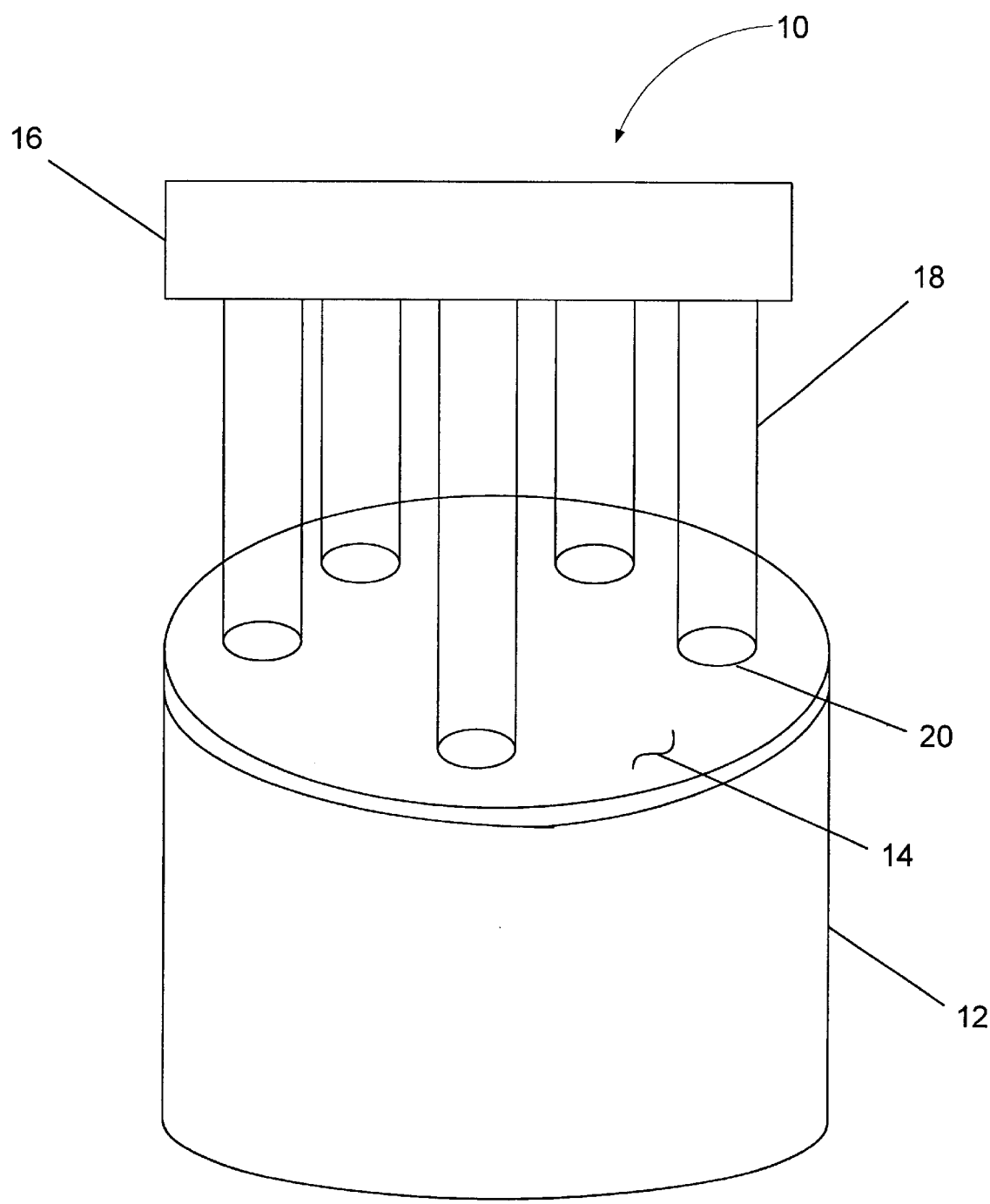
FIG. 1 is a schematic depiction of an illustrative polishing tool that may be used with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–4. The relative sizes of the various features depicted in the drawings may be exaggerated or reduced as compared to the size of those features in actual semiconductor devices and/or processing tools. Nevertheless, the attached drawings are included to describe and explain illustrative examples of the present invention.

In general, the present invention is directed to a method for controlling the thickness of process layers based upon the planarization efficiency of a planarization operation. As will be readily apparent to those skilled in the art upon a complete reading of the present application, the present method is applicable to a variety of technologies, e.g., NMOS, PMOS, CMOS, etc., a variety of devices, including, but not limited to, logic devices, memory devices, etc., and a variety of process layers, e.g., insulating layers, metal layers, polysilicon layers, etc.

Figure 2:
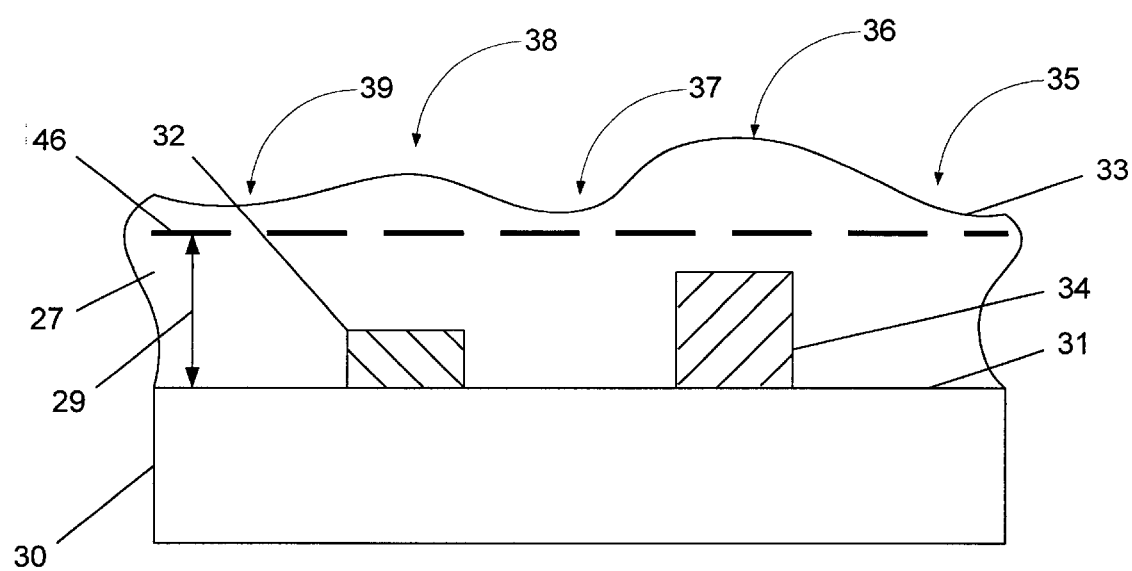
FIG. 2 is a side view of a process layer formed above a semiconducting substrate.

As shown in FIG. 2, a process layer 27 may be formed above a surface 31 of an underlying structure 30. The process layer 27 is formed above a plurality of illustrative structures 32, 34, and has an irregular surface 33. The underlying structure 30 may be any type of structure, e.g., it may be a semiconducting substrate, a previous process layer, or any form of structure over which it is desired to form a process layer. Moreover, the process layer 27 may be comprised of any material, such as silicon dioxide, silicon nitride, etc., and it may be formed by any type of process, such as deposition, thermal growing, etc.

In one illustrative embodiment, the process layer 27 is formed by a deposition process that results in an uneven and irregular surface 33 comprised of a plurality of down features 35, 37, 39 and a plurality of up features 36, 38. In essence, the up features and down features are comprised of a plurality of raised and recessed areas. Note that the up features 36, 38 may have different relative heights, and the down features 35, 37, 39 may have different relative heights. One reason the surface 33 of the process layer 27 may have such an uneven surface is that the process layer 27 is formed over the underlying structures 32, 24, although there may be other reasons why the process layer may produce an irregular surface after it is formed. The 5 structures 32, 34 over which the process layer 27 is formed may be any type of structure, and the structures may vary in their respective heights. For example, the structures 32, 34 may be metal interconnect lines, trench isolation regions, transistors, memory devices, etc.

After the process layer 27 is formed, it is normally desirable that the process layer 27 be subjected to a planarization operation that will ultimately result in a surface 46 (as indicated by dashed lines) that is planar and of a desired thickness (as indicated by arrow 29 ). This desired thickness 29 may be determined relative to any surface or datum point. The degree of planarity, as well as the desired thickness 29, are all matters of design choice that may vary depending upon the particular application under consideration.

Due to many factors, including the inherent nature of planarization operations and existing tool configurations, the rate at which the up features 36, 38 are planarized may differ from the rate at which the down features 35, 37, 39 are planarized. For example, as the surface 33 of the process layer 27 is urged against a rotating polishing pad, which is essentially planar, the polishing pad tends to impact one or more of the up features 36, 38 with greater force than it does the down features 35, 37, 39. However, planarization operations tend to vary over time due to a variety of factors. For example, as a pad becomes worn and more flexible due to use, the down features 35, 37, 39 may be polished at a comparable force to the up features 36, 38. Ideally, it would be desirable to have the planarization operations performed such that the up features 36, 38 are polished at a faster rate than are the down features 35, 37, 39.

One frequently used performance parameter in planarization operations is planarization efficiency which refers to any method for expressing the relative polishing rates for the up features compared to the down features. One illustrative method is depicted by the following formula:

$$\text{Planarization efficiency} = \frac{\text{Polishing rate for up features}}{\text{Polishing rate for down features}}$$

The manner and technique by which the planarization rate for the up features and the planarization rate for the down features may be determined are well known to those skilled in the art. For example the planarization efficiency of a polishing operation may be determined by using patterned monitor or test wafers, e.g., an MIT mask set, or by taking measurements on production wafers and calculating a planarization efficiency. In the case of measuring production wafers, two sites on each of 9–13 die across a wafer may be measured, and a planarization efficiency may be determined based upon that data, although more or fewer sites may be measured. Of course, the particular manner in which a planarization efficiency is calculated should not be considered to be a limitation of the present invention.

Figure 3:
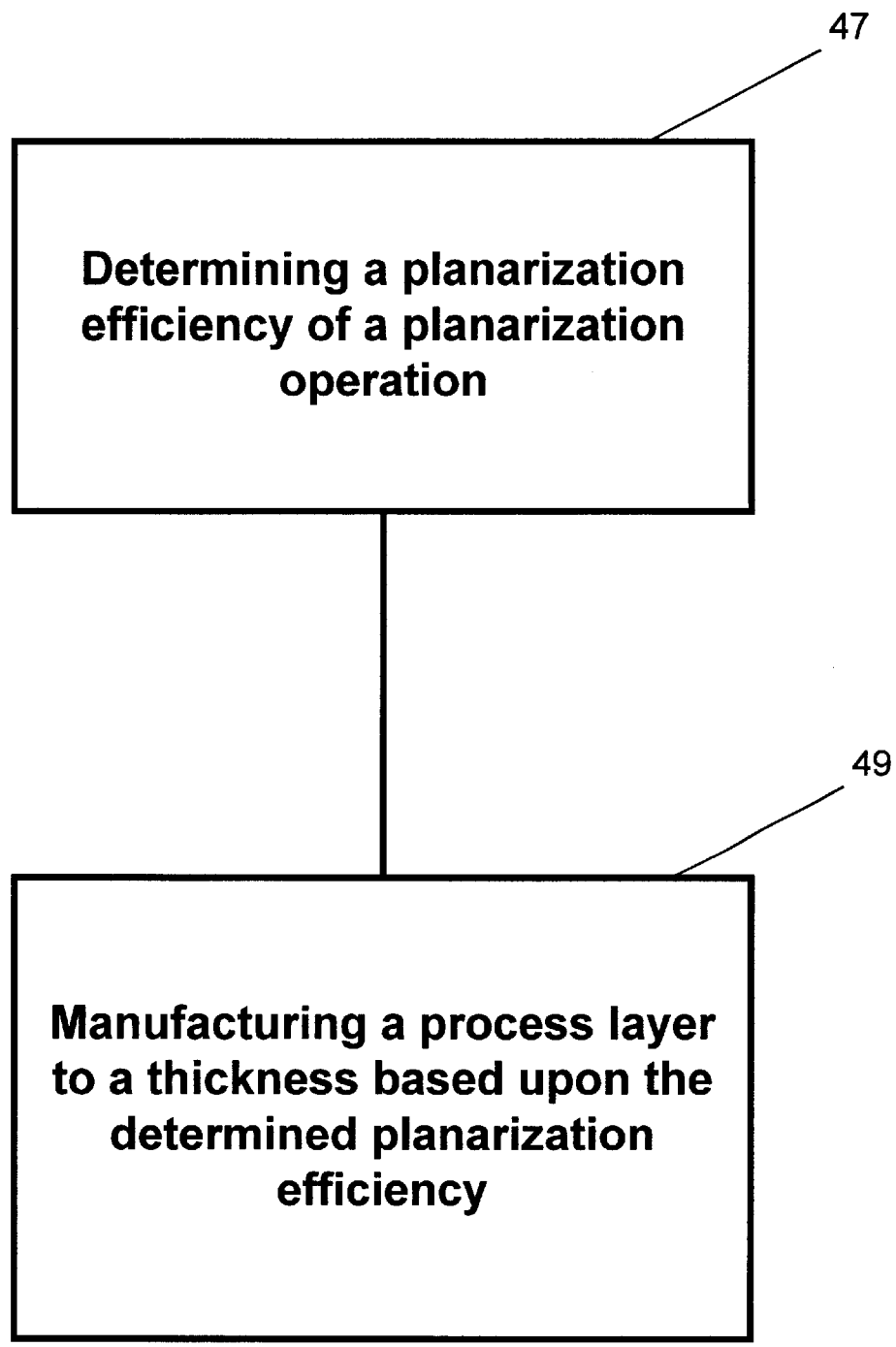
FIG. 3 is a functional block diagram depicting one illustrative embodiment of the present invention.
Figure 4:
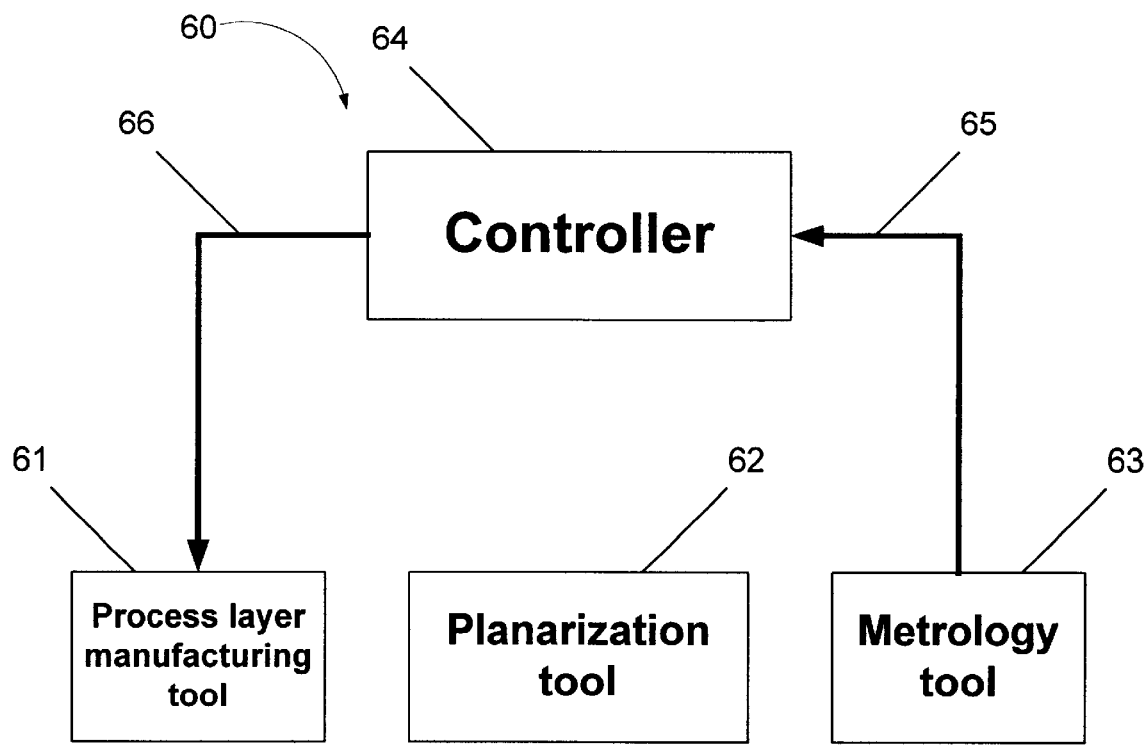
FIG. 4 is an illustrative embodiment of a processing system that may be used with the present invention.

FIG. 3 is a functional block diagram of one illustrative embodiment of the present invention. As shown therein, the present invention comprises determining a planarization efficiency of a planarizing operation, as indicated at block 47, and manufacturing a process layer to a thickness that is based upon the determined planarization efficiency, as indicated at block 49. As stated previously, the step of determining a planarization efficiency may be accomplished by any of a variety of known techniques for determining such efficiencies.

The step of manufacturing a process layer to a thickness based upon the determined efficiency may be accomplished by controlling or varying any parameter of a processing recipe associated with the formation of the process layer so as to effect the as-formed thickness of the process layer. For example, in the case of a deposition process, the deposition time may be varied to increase or decrease the nominal thickness of the process layer. Alternatively, temperature, as well as liquid and/or gas flow rates, may be increased or decreased to control the thickness of the process layer. A variety of hardware, software and control techniques may be used to implement the present invention.

The present invention may also be embodied in a machine or computer readable format, e.g., an appropriately programmed computer, a software program written in any of a variety of programming languages. The software program would be written to carry out various functional operations of the present invention, such as those indicated in FIG. 3, and elsewhere in the specification. The software program may be run on a variety of devices, e.g., a processor. Moreover, a machine or computer readable format of the present invention may be embodied in a variety of program storage devices, such as a diskette, a hard disk, a CD, a DVD, a nonvolatile electronic memory, or the like.

The present invention is also directed to a processing system, e.g., a processing tool or combination of processing tools, for accomplishing the present invention. As shown in FIG. 4, a system 60 is comprised of a process layer manufacturing tool 61, a planarization tool 62, a metrology tool 63, and a controller 64. In one illustrative process flow, process layers are formed in the process layer manufacturing tool 61, and then a surface of the process layer is planarized in the planarization tool 62. Thereafter, measurements of the surface of the process layer after polishing operations may be taken by the metrology tool 63.

Once the planarization efficiency is determined, it may be sent to the controller 64 via input line 6;. In turn, the controller 64 may send commands to the process layer manufacturing tool 61, via output line 66, to adjust or vary the manufactured thickness of a process layer based upon the planarization efficiency. The output of the controller 64 may incrementally increase or decrease a previously stored value, or it may be a new absolute value.

The process layer manufacturing tool 61 may be any of a variety of tools used to manufacture process layers encountered in semiconductor fabrication operations. In one illustrative embodiment, the process layer manufacturing tool 61 is a deposition tool, e.g., a CVD chamber, that makes process layers by a deposition process. The planarization tool 62 may be any of a variety of tools used to planarize a process layer after it has been formed. In one illustrative embodiment, the planarization tool 62 is comprised of a chemical mechanical polishing ("CMP") tool. The metrology tool 63 may be any of a variety of tools useful in determining the planarization efficiency of a planarizing operation. In one illustrative embodiment, the metrology tool 63 is an Optiprobe® tool manufactured by Thermawave. Moreover, the process layer manufacturing tool 61, planarization tool 62, and metrology tool 63 may be stand-alone units, or they may be combined with one another in a processing tool. For example, the metrology tool 63 may be combined with the planarization tool 62.

The controller 64 may be any type of device that includes logic circuitry for executing instructions. Moreover, the controller 64 depicted in FIG. 10 may be a stand-alone controller or it may be one or more of the controllers already resident on either or both of the process layer manufacturing tool 61, the planarization tool 62, or the metrology tool 63.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising
   determining a planarization efficiency of a planarization operation; and
   manufacturing a process layer to a thickness based upon the determined planarization efficiency.

2. The method of claim 1, wherein determining a planarization efficiency of a planarization operation comprises measuring a plurality of sites on a production wafer and calculating a planarization efficiency.

3. The method of claim 1, wherein determining a planarization efficiency of a planarization operation comprises determining a planarization efficiency using patterned test wafers.

4. The method of claim 1, wherein determining a planarization efficiency of a planarization operation comprises determining a planarization efficiency of a chemical mechanical polishing operation.

5. The method of claim 1, wherein manufacturing a process layer to a thickness based upon the determined planarization efficiency comprises varying at least one parameter of a processing recipe used to produce a process layer.

6. The method of claim 1, wherein manufacturing a process layer to a thickness based upon the determined planarization efficiency comprises depositing a process layer to a thickness based upon the determined planarization efficiency.

7. The method of claim 6, wherein depositing a process layer to a thickness based upon the determined planarization efficiency comprises varying at least one parameter of a deposition recipe used to produce a process layer.

8. The method of claim 7, wherein varying at least one parameter of a deposition recipe used to produce a process layer comprises varying a time duration of said deposition process.

9. The method of claim 7, wherein varying at least one parameter of a deposition recipe used to produce a process layer comprises varying a gas flow rate of said deposition process.

10. The method of claim 7, wherein varying at least one parameter of a deposition recipe used to produce a process layer comprises varying a temperature of said deposition process.

11. A method, comprising:
    determining a planarization efficiency of a chemical mechanical polishing operation; and
    depositing a process layer to a thickness based upon the determined planarization efficiency.

12. The method of claim 11, wherein determining a planarization efficiency of a planarization operation comprises measuring a plurality of sites on a production wafer and calculating a planarization efficiency.

13. The method of claim 11, wherein determining a planarization efficiency of a planarization operation comprises determining a planarization efficiency using patterned test wafers.

14. The method of claim 11, wherein depositing a process layer to a thickness based upon the determined planarization efficiency comprises varying at least one parameter of a deposition recipe used to produce a process layer.

15. The method of claim 14, wherein varying at least one parameter of a deposition recipe used to produce a process layer comprises varying a time duration of said deposition process.

16. The method of claim 14, wherein varying at least one parameter of a deposition recipe used to produce a process layer comprises varying a gas flow rate of said deposition process.

17. The method of claim 14, wherein varying at least one parameter of a deposition recipe used to produce a process layer comprises varying a temperature of said deposition process.

18. A method, comprising:
    determining a planarization efficiency of a planarization operation performed on a first process layer; and
    manufacturing a second process layer to a thickness based upon the determined planarization efficiency.

* * * * *